US008963218B2

(12) United States Patent
Sobti et al.

(10) Patent No.: US 8,963,218 B2
(45) Date of Patent: Feb. 24, 2015

(54) DUAL-GATE VDMOS DEVICE

(75) Inventors: Harmeet Sobti, Portland, OR (US); Timothy K. McGuire, Beaverton, OR (US); David L. Snyder, Beaverton, OR (US); Scott J. Alberhasky, Portland, OR (US)

(73) Assignee: Maxim Integrated Products, Inc., San Jose, CA (US)

( * ) Notice: Subject to any disclaimer, the term of this patent is extended or adjusted under 35 U.S.C. 154(b) by 108 days.

(21) Appl. No.: 13/249,594

(22) Filed: Sep. 30, 2011

(65) Prior Publication Data
US 2013/0082321 A1    Apr. 4, 2013

(51) Int. Cl.
*H01L 29/66* (2006.01)
*H01L 29/08* (2006.01)
*H01L 29/423* (2006.01)
*H01L 29/78* (2006.01)
*H01L 29/10* (2006.01)

(52) U.S. Cl.
CPC ...... *H01L 29/0878* (2013.01); *H01L 29/42368* (2013.01); *H01L 29/42372* (2013.01); *H01L 29/42376* (2013.01); *H01L 29/66719* (2013.01); *H01L 29/7802* (2013.01); *H01L 29/1095* (2013.01)
USPC .................... 257/263; 257/302; 257/E29.262

(58) Field of Classification Search
USPC ........................... 257/263, 302, 328, E29.262
See application file for complete search history.

(56) References Cited

U.S. PATENT DOCUMENTS

| 6,391,723 | B1 * | 5/2002 | Frisina .......................... 438/268 |
| 7,084,456 | B2 | 8/2006 | Williams et al. |
| 7,504,676 | B2 | 3/2009 | Bhalla et al. |
| 7,592,228 | B2 | 9/2009 | Williams et al. |
| 2005/0035398 | A1 | 2/2005 | Williams et al. |
| 2006/0186434 | A1 * | 8/2006 | Magri' et al. ................. 257/135 |
| 2006/0246650 | A1 | 11/2006 | Williams et al. |
| 2007/0278571 | A1 | 12/2007 | Bhalla et al. |
| 2009/0181503 | A1 | 7/2009 | Bhalla et al. |
| 2012/0126314 | A1 * | 5/2012 | Braithwaite et al. .......... 257/329 |

FOREIGN PATENT DOCUMENTS

| WO | 2006011882 | 2/2006 |
| WO | 2007143130 | 12/2007 |

OTHER PUBLICATIONS

Wang Cuixia, Cen Feng, Kan Hongjin, Yu Youling; Low-FOM planar MOSFET; 2010 2nd International Conference on Industrial Mechatronics and Automation; 2010; pp. 460-463.

* cited by examiner

*Primary Examiner* — Matthew Reames
(74) *Attorney, Agent, or Firm* — Advent, LLP

(57) ABSTRACT

Semiconductor devices are described that include a dual-gate configuration. In one or more implementations, the semiconductor devices include a substrate having a first surface and a second surface. The substrate includes a first and a second body region formed proximal to the first surface. Moreover, each body region includes a source region formed therein. The substrate further includes a drain region formed proximal to the second surface and an epitaxial region that is configured to function as a drift region between the drain region and the source regions. A dual-gate is formed over the first surface of the substrate. The dual-gate includes a first gate region and a second gate region that define a gap there between to reduce the gate to drain capacitance.

14 Claims, 4 Drawing Sheets

DUAL-GATE VDMOS DEVICE

BACKGROUND

Power metal-oxide-semiconductor field-effect transistor (MOSFET) devices, such as vertical diffused metal oxide semiconductor (VDMOS) devices, are used in power application devices because they complement both bipolar devices and complementary metal-oxide-semiconductor CMOS devices through bi-polar-CMOS-DMOS (BCD) processes. For example, VDMOS devices may be used in power supplies, buck converters, and low voltage motor controllers to furnish power application functionality.

The on-state resistance ("$R_{ON}$"), the maximum breakdown voltage ("$BV_{DSS}$"), and the overall capacitances of the device are important characteristics of VDMOS designs. These characteristics are important operating parameters of the VDMOS devices, which dictate the applications with which the devices may be utilized. On-state resistance is usually dependent upon the design and layout of the device, the process condition, temperature, drift region length, doping concentration of the drift region, and the various materials used to fabricate the devices. Breakdown voltage is defined as the largest reverse voltage that can be applied to the drain of the transistor without causing an exponential increase in the current. Moreover, various parasitic capacitances in the devices lead to reduced operating frequency.

SUMMARY

Semiconductor devices, such as VDMOS devices, are described that include a dual-gate configuration to reduce the gate to drain capacitance ($C_{gd}$) of the devices. In one or more implementations, the semiconductor devices include a substrate having a first surface and a second surface. The substrate includes a first and second body region formed proximal to the first surface. Each body region includes a source region formed therein. The substrate further includes a drain region formed proximal to the second surface and an epitaxial region that is configured to function as a drift region between the drain region and the source regions. A dual-gate is formed over the first surface of the substrate. The dual-gate includes a first gate region and a second gate region that define a gap there between to reduce the gate to drain capacitance.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

DRAWINGS

The detailed description is described with reference to the accompanying figures. The use of the same reference numbers in different instances in the description and the figures may indicate similar or identical items.

DETAILED DESCRIPTION

Overview

Power devices, such as buck converters, typically require an output device having a low resistance (e.g., $R_{ON}$) and low gate capacitance values to allow for increased operating frequencies. Thus, lower device capacitances allow for greater operating and performance efficiency.

Therefore, techniques are described to form semiconductor devices, in particular VDMOS devices, that include dual-gates to reduce the gate to drain capacitance ($C_{gd}$) of the devices. In one or more implementations, the semiconductor devices include a substrate having a first surface and a second surface. The substrate includes a first and a second body region formed proximal to the first surface. Each body region includes a source region formed therein. The substrate further includes a drain region formed proximal to the second surface and an epitaxial region that is configured to function as a drift region between the drain region and the source regions. In an implementation, the epitaxial region includes a junction field effect transistor (JFET) diffusion region to reduce the effective channel length of the device. A dual-gate is formed over the first surface of the substrate. The dual-gate includes a first gate region and a second gate region that define a gap there between to reduce the gate to drain capacitance. In an implementation, one or more drain side spacers are formed in the gap to also reduce the gate to drain capacitance. In another implementation, a conductive layer is formed over the first gate region and the second gate region to lower the effective resistance of the dual-gate. The devices may also include one or more below source regions that may reduce the effective gate length of the dual-gate.

In the following discussion, an example semiconductor device is first described. Exemplary procedures are then described that may be employed to fabricate the example semiconductor device.

Example Implementations

Figure 1A:
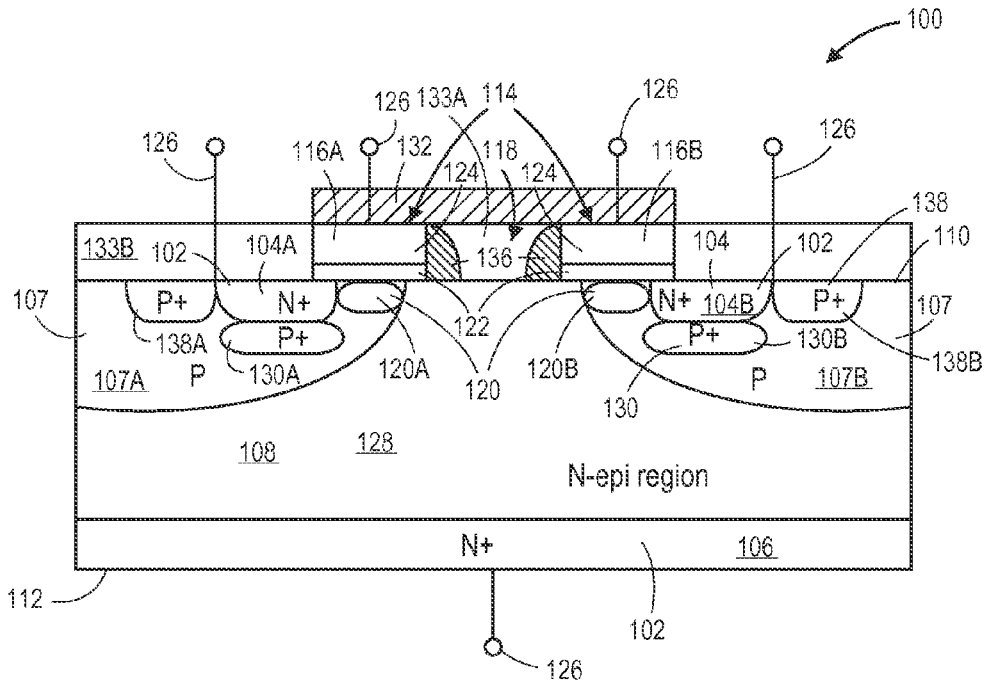
FIG. 1A is a diagrammatic partial cross-sectional view illustrating an implementation of a VDMOS device in accordance with an example implementation of the present disclosure.
Figure 1B:
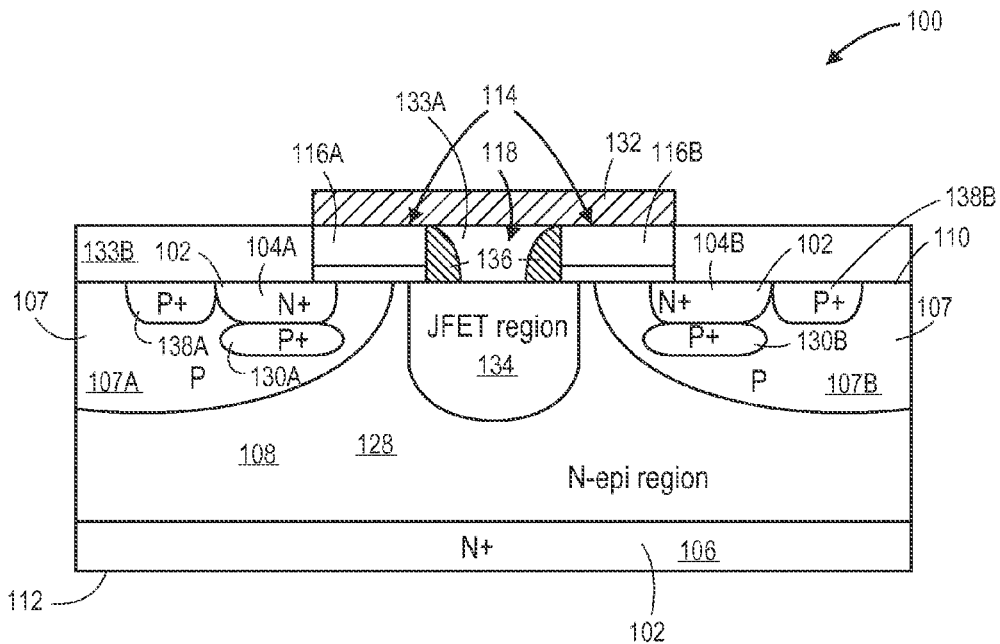
FIG. 1B is a diagrammatic partial cross-sectional view illustrating another implementation of a VDMOS device in accordance with another example implementation of the present disclosure, wherein the VDMOS device includes a JFET diffusion region.

FIGS. 1A and 1B illustrate vertically diffused metal-oxide semiconductor (VDMOS) devices 100 in accordance with example implementations of the present disclosure. As shown, the VDMOS device 100 includes one or more active regions 102 formed in a substrate 108 (source regions 104 and a drain region 106 are illustrated). The active regions 102 are utilized to create integrated circuit device technology (e.g., complementary metal-oxide-semiconductor (CMOS) technology, microelectromechanical systems (MEMS) technology, etc.). In implementations, the active regions 102 provide charge carriers to the substrate 108. For example, an active silicon region 102 may comprise a material of a first conductivity type (e.g., n-type diffusion region) that provides extra conduction electrons as charge carriers. In another example, an active silicon region 102 may comprise material of a second conductivity type (e.g., p-type diffusion region) that is configured to provide extra holes as charge carriers. As shown in FIGS. 1A and 1B, the source regions 104 are formed proximate to a first surface 110 of the substrate 108, and the drain region 106 is formed proximate to a second surface 112 of the substrate 108. For example, the source regions 104 are formed below and adjacent the surface 110, and the drain region is formed below and adjacent to the surface 112.

As shown in FIGS. 1A and 1B, the device 100 includes a first source region 104A and a second source region 104B, as well as a single drain region 106. The source regions 104A, 104B are formed in body regions 107 (e.g., the first source region 104A is formed in a first body region 107A and the second source region 104B is formed in a second body region 107B). The body regions 107A, 107B are comprised of a dopant material of a second conductivity type (e.g., p-type material). In one or more implementations, the source regions 104A, 104B and the body regions 107A, 107B may be self-aligned regions fabricated through suitable self-alignment implantation techniques (e.g., implantation, annealing, etc.). In one or more implementations, the body regions 107A, 107B may have a dopant concentration of about $1\times10^{16}/cm^3$ to about $1\times10^{18}/cm^3$ of the second conductivity type.

The substrate 108 comprises a base material utilized to form one or more integrated circuit devices through various semiconductor fabrication techniques, such as photolithography, ion implantation, deposition, etching, and so forth. In one or more implementations, the substrate 108 comprises a portion of a silicon wafer that may be configured in a variety of ways. For example, the substrate 108 may comprise a portion of an n-type silicon wafer or a portion of a p-type silicon wafer. In an implementation, the substrate 108 may comprise group V elements (e.g., phosphorus, arsenic, antimony, etc.) configured to furnish n-type charge carrier elements. In another implementation, the substrate 108 may comprise group MA elements (e.g., boron, etc.) configured to furnish p-type charge carrier elements.

The devices 100 include a dual-gate 114 that is formed over the surface 110. As shown, the dual-gate 114 includes two gate regions 116 (a first gate region 116A and a second gate region 116B) that define a gap 118 there between. The first gate region 116A is formed at least partially over the first source region 104A and the first body region 107A. The second gate region 116B is formed at least partially over the second source region 104B and the second body region 107B. Thus, conduction regions 120 are formed within the body regions 107A, 107B that are below the two gate regions 116A, 116B when a voltage of correct polarity and a value greater than a threshold voltage ($V_t$) of the device 100 is applied to the dual-gate 114. For example, a first conduction region 120A is associated with the first gate region 116A, and the second conduction region 120B is associated with the second gate region 116B. The conduction regions 120 establish a conducting channel through which charge carriers (e.g., majority carriers) can travel between the source regions 104 and the drain region 106. As shown, the dual-gate 114 may include a first layer 122, such as a dielectric layer, disposed between the surface 110 and a second layer 124 (e.g., a polycrystalline silicon (polysilicon) layer or a metal electrode layer). In one or more implementations, the first layer 122 may comprise a gate oxide material, such as silicon dioxide ($SiO_2$), a nitride material, a high-κ material, or the like. The second layer 124 may further include a silicide material to lower the resistivity of the layer 124. In various implementations, the thickness of the gate may range from approximately one hundred (100) Angstroms to approximately one hundred thousand (100,000) Angstroms. However, the thickness of the dual-gate 114 may vary as a function of the requirements (e.g., manufacturability, operating frequency, gain, efficiency, etc.) of the device 100.

The source regions 104, the drain region 106, and the gate regions 116A, 116B have contacts 126 (e.g., an electrode) that provide electrical interconnection functionalities between various components of devices 100. The contacts 126 may be configured in a variety of ways. For example, the contacts 126 may be comprised of a polysilicon material, a metal one (metal 1) material, a metal two (metal 2) material, and so forth. In some applications, the contacts 126 may include vias that provide a vertical electrical connection between different layers of the device 100. For instance, a first via may provide an electrical interconnect to a drain contact 126 formed proximate to the first surface 110 and disposed under various device 100 layers (e.g., passivation layers, insulation layers, etc.).

The semiconductor device 100 further includes an epitaxial region 128 that is configured as a path for majority carriers to travel when the device 100 is operational. For instance, the epitaxial region 128 is configured to function as a drift region when the device 100 is operational. As illustrated in FIGS. 1A and 1B, the epitaxial region 128 extends from under the dual-gate 114 to the drain region 106. Moreover, the epitaxial region 128 at least partially encloses the body regions 107A, 107B. The epitaxial region 128 comprises a material that is the same conductivity type as the source regions 104 and the drain region 106 (e.g., a first conductivity type). However, the doping profile of the epitaxial region 128 is lower than the doping profile of the source regions 104. For example, the epitaxial region 128 may have a dopant concentration of about $1\times10^{14}/cm^3$ to about $1\times10^{17}/cm^3$ of the first conductivity type. The electric field across the epitaxial region 128 may be manipulated by the doping profile and the thickness of the epitaxial region 128 when the device 100 is operational. Thus, it is contemplated that various doping profiles and thicknesses of the epitaxial region 128 may be utilized depending on the requirements (e.g., breakdown voltage value, operating voltages, etc.) of the VDMOS devices 100.

As shown in FIGS. 1A and 1B, below source regions 130 (e.g., a first below source region 130A, a second below source region 130B) are disposed below each of the source regions 104A, 104B. The below source regions 130 comprise material of a second conductivity type. In an implementation, the below source regions 130 may be boron implanted regions. The regions 130 are configured to reduce the effective gate length of the dual-gate 114 in the VDMOS devices 100. The regions 130 may have a dopant concentration of about $5\times10^{16}/cm^3$ to about $1\times10^{19}/cm^3$ of the second conductivity type. The VDMOS devices 100 may have varying doping profiles that depend on the requirements of the devices 100. In an implementation, the first region 130A and the second region 130B may have approximately the same dopant concentration. In another implementation, the first region 130A may have a first dopant concentration, and the second region 130B may have a second dopant concentration that is different from the first dopant concentration. The dopant concentration of the regions 130 may be higher than the dopant concentration of the body regions 107.

The VDMOS devices 100 may include a conductive layer 132 disposed over the surface 110. As shown in FIGS. 1A and 1B, the conductive layer 132 at least substantially extends over the gate regions 116A, 116B and an insulation layer 133A. The conductive layer 132 is configured to connect (e.g., strap) the gate regions 116A, 116B together and to lower the effective resistance of the dual-gate 114. The conductive layer 132 may be comprised of a metal layer, such as aluminum, or the like. In one or more implementations, the conductive layer 132 may have a thickness of about 0.1 microns to about 0.5 microns. In an example, the thickness of the conductive layer 132 may be about 0.2 microns (2000 Angstroms). As shown, the insulation layer 133A is disposed in the gap 118, and the insulation layer 133B is disposed at least partially over the surface 110. In one or more implementations, the insulation layers 133A, 133B may comprise a dielectric material, such as a silicon dioxide ($SiO_2$) material, a benzocyclobutene (BCB) material, or the like. In an implementation, the insulation layers 133A, 133B may be formed through different deposition and removal (e.g., etching, planarizing, etc.) processes.

As shown in FIG. 1B, the devices 100 may also include a junction field effect transistor (JFET) diffusion region 134 disposed in the epitaxial region 128. The JFET diffusion region 134 is encompassed by the epitaxial region 128 and extends from about the first surface 110 (e.g., positioned underneath the gate regions 116A, 116B and the dielectric region 134) to below at least one of the body regions 107 (first body region 107A, second body region 107B). The JFET diffusion region 134 is comprised of a first conductivity material. The JFET diffusion region 134 has a doping concentration that is greater than the doping concentration of the epitaxial region 128 to reduce the channel resistance of the devices 100. For example, the JFET diffusion region 134 may have a dopant concentration of about $1\times10^{15}/cm^3$ to about $1\times10^{17}/cm^3$ of the first conductivity type.

As described above, the first gate region 116A and the second gate region 116B of the dual-gate 114 define a gap 118 to allow for a reduction of the gate to drain capacitance ($C_{gd}$) (e.g., the overlap of the dual-gate 114 and the epitaxial region 128 (as well as the JFET diffusion region 134 in some implementations)). The gate to drain capacitance may also be reduced by drain side spacers 136. Drain side spacers 136 may be formed in the gap 118 proximate to the first gate region 116A and the second gate region 116B. For example, a first drain side spacer 136 may be formed adjacent to the first gate region 116A, and a second drain side spacer 136 may be formed adjacent to the second gate region 116B. In one or more implementations, drain side spacers 136 may be formed of polysilicon, amorphous polysilicon, doped polysilicon, metal, silicon oxide, silicon nitride, silicon oxynitride layer, combinations thereof, and so forth.

The VDMOS devices 100 may also include body contact regions 138A, 138B that are comprised of a second conductivity type (shown as P+ region in FIGS. 1A and 1B). In one or more implementations, the source regions 104A, 104B and the body contact regions 138A, 138B are tied together by the contacts 126 to improve reliability of the devices 100 and to reduce parasitic effects. For example, the source region 104A is tied together with the body contact region 138A by a first contact 126, and the source region 104B is tied together with the body contact region 138B by a second contact 126.

It will be understood that while FIGS. 1A and 1B illustrate an n-channel VDMOS device 100, the devices 100 may be fabricated as p-channel devices. For example, a p-channel device may include p-type source and drain regions, a p-type drift region, and so forth.

Example Fabrication Processes

Figure 2:
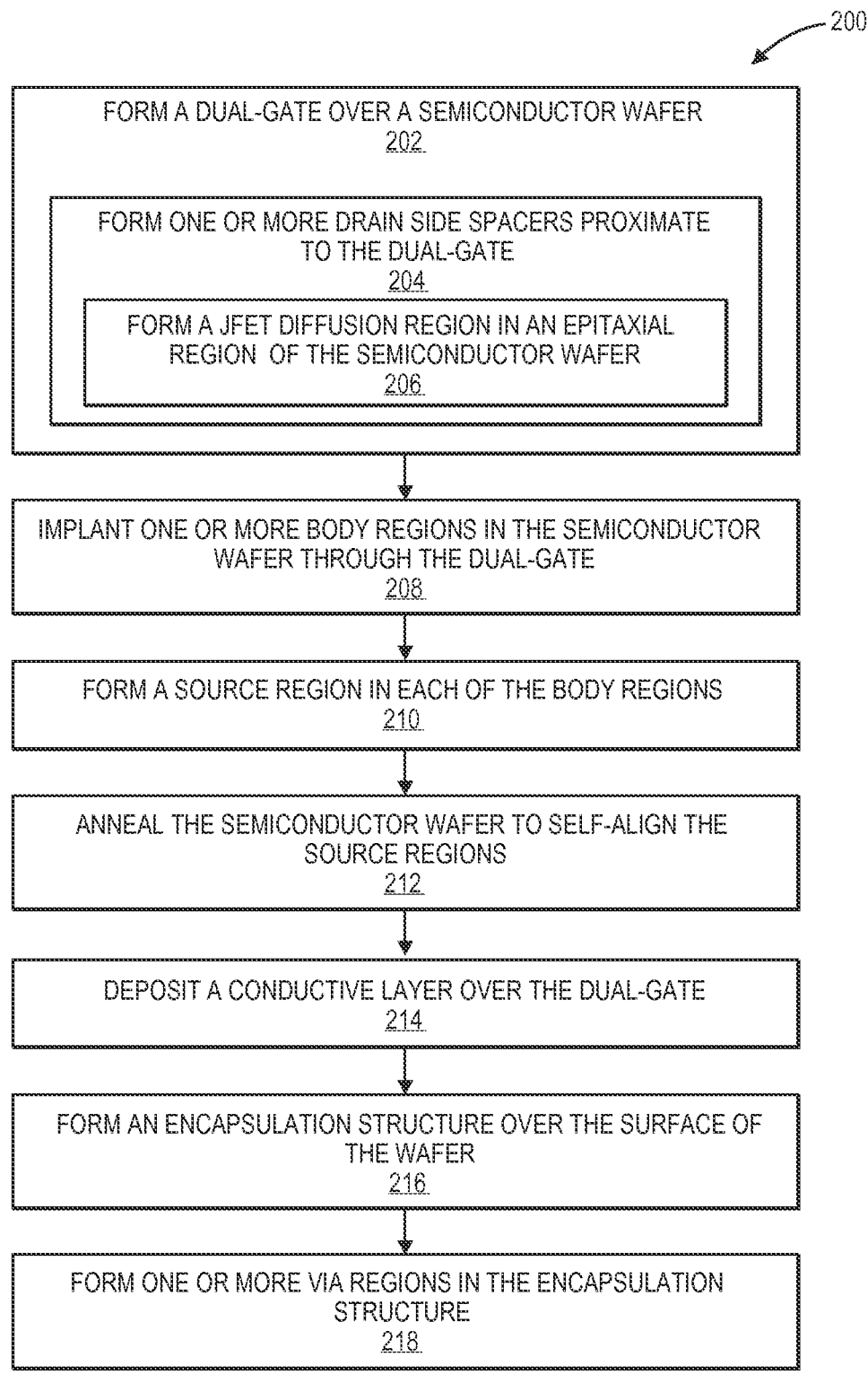
FIG. 2 is a flow diagram illustrating a process in an example implementation for fabricating VDMOS devices, such as the devices shown in FIGS. 1A and 1B.
Figure 3A:
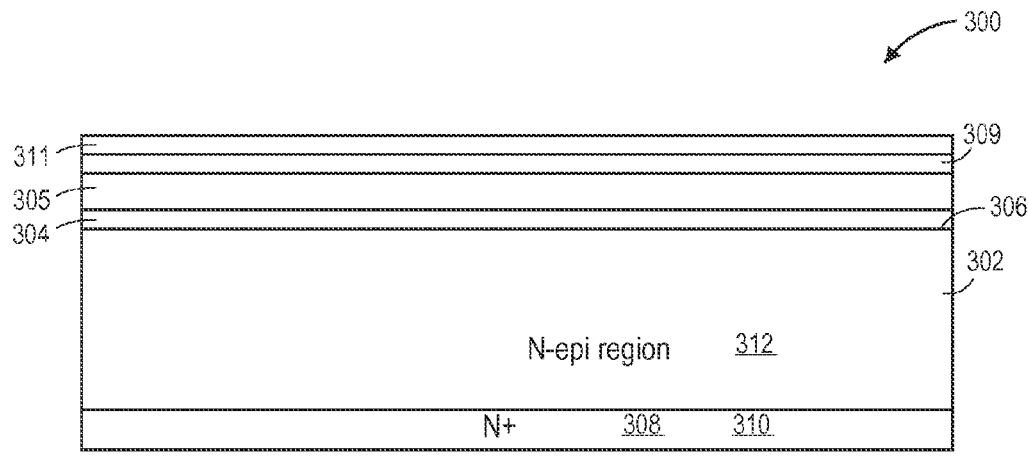
FIGS. 3A through 3E are diagrammatic partial cross-sectional views illustrating the fabrication of a VDMOS device, such as the device shown in FIGS. 1A and 1B, in accordance with the process shown in FIG. 2.

FIG. 2 illustrates an example process 200 that employs semiconductor fabrication techniques to fabricate semiconductor devices, such as the devices 100 shown in FIGS. 1A and 1B. FIGS. 3A through 3E illustrate formation of example VDMOS devices 300 in an example wafer 302. As illustrated in FIG. 3A, a dual-gate is formed over a semiconductor wafer (Block 202). An oxide layer 304 and a polysilicon layer 305 are formed over a top surface 306 of the wafer 302 to form the dual-gate 307. In some implementations, as shown in FIG. 3A, a silicide layer 309 may be deposited over the polysilicon layer 305, and an oxide layer 311 may be deposited over the silicide layer 309. The wafer 302 includes a bottom layer 308 comprised of a first conductivity type (e.g., n-type dopant material) that functions as a drain region 310. The wafer 302 includes an epitaxial region 312 of a first conductivity type disposed over the bottom layer 308. The epitaxial region 312 is configured to function as a drift region when the device 300 is operational. The epitaxial region 312 may have a dopant concentration of about $1\times10^{14}/cm^3$ to about $1\times10^{17}/cm^3$ of the first conductivity type. It is contemplated that various doping profiles and thicknesses may be utilized depending on the VDMOS device 300 requirements (e.g., maximum operating voltage, etc.). The dual-gate 307 includes a first gate region 314 and a second gate region 316 that define a gap 318 there between (see FIG. 3B). As described above, the dual-gate 307 configuration reduces the gate to drain capacitance ($C_{gd}$) of the device 300. One or more drain side spacers may be formed proximate to the dual-gate (Block 204) to further reduce the gate to drain capacitance. In an implementation, one or more drain side spacers 319 are formed proximate to the dual-gate 307. For example, a first drain side spacer 319A may be formed adjacent to the first gate region 314 in the gap 318, and a second drain side spacer 319B may be formed adjacent to the second gate region 316 in the gap 318.

Figure 3B:
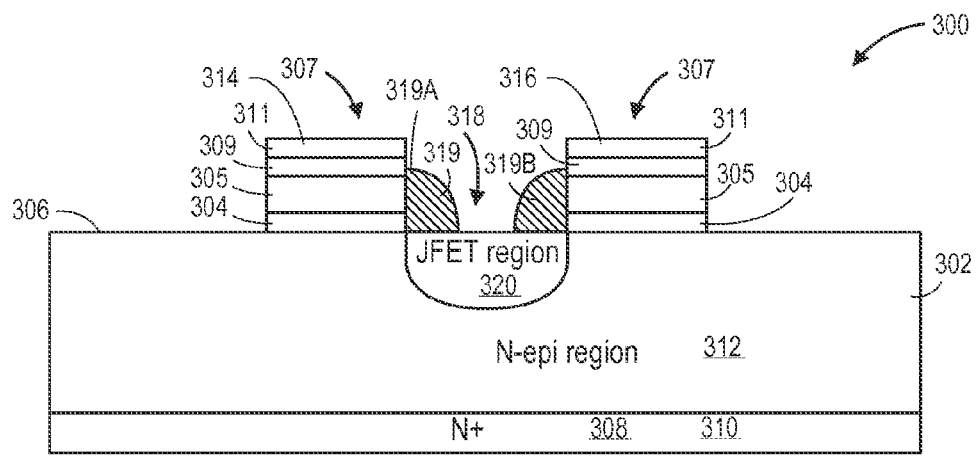

In one or more implementations, a JFET diffusion region is formed in the epitaxial region (Block 206). As shown in FIG. 3B, the epitaxial region 312 may include a JFET diffusion region 320 of the first conductivity type. The JFET diffusion region 320 may be formed through various suitable implantation and diffusion techniques. For example, the JFET diffusion region 320 may be implanted through the dual-gate 307. The JFET diffusion region is utilized to further reduce the channel resistance, and, hence, further reduce the on-state resistance of the device 300. The JFET diffusion region 320 may have a doping concentration that is greater than the epitaxial region 312 to reduce the channel resistance of the devices 300. For example, the JFET diffusion region 320 may have a dopant concentration of about $1\times10^{15}/cm^3$ to about $1\times10^{17}/cm^3$ of the first conductivity type.

Figure 3C:
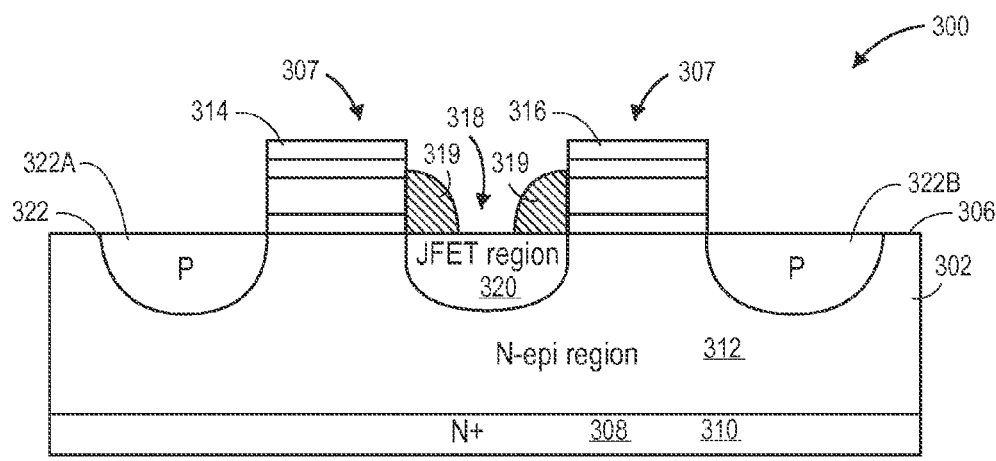

One or more body regions are implanted in the semiconductor wafer through the dual-gate (Block 208). As shown in FIG. 3C, one or more body regions 322 (a first body region 322A, a second body region 322B) are implanted in the wafer 302. The body regions 322 comprise a second conductivity material (e.g., p-type dopant material). The body regions 322 may be implanted through the dual-gate 307 at various angles. In one or more implementations, the body regions 322 may be implanted at about a thirty (30) degree angle with respect to a horizontal axis defined by the top surface 306 to minimize the dual-gate 307 capacitance. However, it understood that the body regions 322 may be implanted at other angles depending upon the device 300 requirements. In an implementation, the first body region 322A may be implanted at a first angle with respect to a horizontal axis defined by the top surface 306, and the second body region 322B may be implanted at a second angle (the second angle being different than the first angle) with respect to a horizontal axis defined by the top surface 306. For example, the first angle may be thirty-five (35) degrees and the second angle may be twenty-five (25) degrees. In one or more implementations, the body regions 322A, 322B may have a dopant concentration of about $1\times10^{16}/cm^3$ to about $1\times10^{18}/cm^3$ of the second conductivity type. Moreover, below source regions 323 (first below source region 323A, second below source region 323B) may also be implanted after formation of the body regions 322A, 322B to reduce the effective gate length of the VDMOS device 300 when the VDMOS device 300 is operational. The regions 323A, 323B may be implanted at the same or different angles as the body regions 322A, 322B depending upon the desired requirements and desired characteristics of the device 300. The regions 323A, 323B are comprised of the second conductivity type and have a dopant concentration higher than the dopant concentration of the body regions 322A, 322B. For example, the regions 323A, 323B may have a dopant concentration of about $5 \times 10^{16}/cm^3$ to about $1 \times 10^{19}/cm^3$ of the second conductivity type.

Figure 3D:
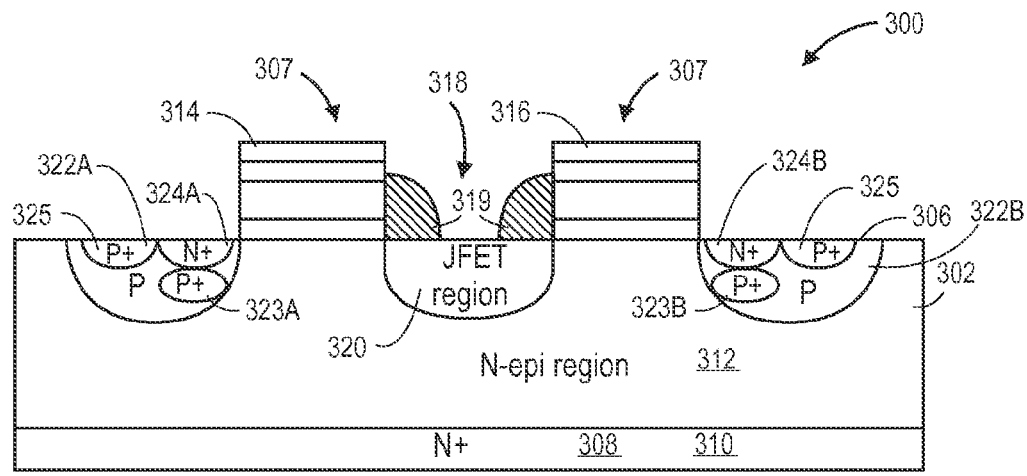
Figure 3E:
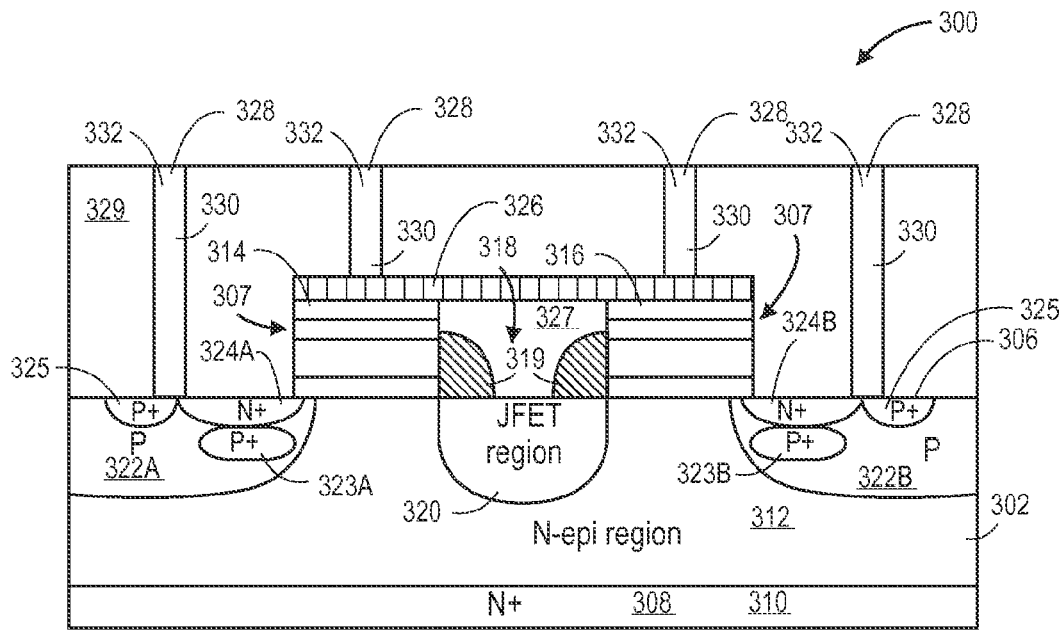

A source region is formed in each of the body regions (Block 210). As described above, the source regions 324A, 324B are comprised of the first conductivity type (e.g., n-type material). In one or more implementations, the source regions 324A, 324B are implanted through suitable implantation techniques. For example, the source regions 324A, 324B may be formed by first implanting a doped material of a first conductivity type in the body regions 322A, 322B. As shown in FIG. 3D, the source regions 324A, 324B are first implanted proximal to the dual-gate 307. For example, the source regions 324A, 324B may abut the epitaxial region 312 that is under the dual-gates 314 to allow for further self-alignment processes (before annealing). The VDMOS devices 300 may further include one or more body contact regions 325 of the second conductivity type deposited in each of the body regions 322 to reduce the parasitic effects of the device 300. The semiconductor wafer may then be annealed (Block 212) so that a portion of each source region is formed under the dual-gate. FIG. 3E illustrates a portion of a wafer 302 after the wafer 302 has undergone an annealing process to self-align the source regions 324A, 324B under the dual-gate 307.

A conductive layer is deposited over the dual-gate (Block 214). For example, the conductive layer 326 may be deposited over the dual-gate 307. For instance, the conductive layer 326 may be formed over the first and second gate regions 314, 316 and an insulation region 327 formed in the gap 318. The insulation region 327 may be formed (e.g., deposited and then selectively removed) over the surface 306 prior to deposition of the conductive layer 326. In one or more implementations, the insulation region 327 may comprise a dielectric material, such as a silicon dioxide ($SiO_2$) material, a benzocyclobutene (BCB) material, or the like. The conductive layer 326 serves to reduce the resistance of the gate regions 314, 316 and connect the gate regions 314, 316 together. It is understood that additional semiconductor fabrication processes may be utilized to remove excess areas of the conductive layer 326 from the device 300. In one or more implementations, the conductive layer 326 may comprise a metal layer, such as aluminum, and may be approximately 0.1 microns to about 0.5 microns thick. In an example, the conductive layer 326 may have a thickness of about 2000 Angstroms.

An encapsulation structure is then formed over the surface of the wafer (Block 216). As shown in FIG. 3E, an encapsulation structure 329 is formed (deposited, planarized, etc.) over the surface 306 of the wafer 302 to enclose the dual-gate 307. The encapsulation structure 329 may be configured in a variety of ways. For example, the encapsulation structure 329 may comprise a dielectric material, as a silicon dioxide ($SiO_2$) material, a benzocyclobutene (BCB) material, or the like. One or more via regions are formed in the encapsulation structure (Block 218). FIG. 3E illustrates via regions 328 formed through one or more etching processes (e.g., wet etching, dry etching) in the encapsulation structure 329 to allow connections to the dual-gate 307 (e.g., first gate region 314, second gate region 316) and the source regions 324A, 324B. A conductive material 330 is deposited (e.g., physical vapor deposition, chemical vapor deposition, molecular beam epitaxy, etc.) in the via regions 328 to form contacts 332 that provide electrical interconnections between various components of the device 300. A dielectric material may be formed along the sidewalls of the via regions 328 to prevent shorting of the encapsulation structure 329 and the conductive material 330. In one or more implementations, the conductive material 330 may be comprised of a polysilicon material, a metal 1 material, a metal 2 material, and so forth. The contacts 332 form electrodes for the dual-gate 307 and the source regions 324A, 324B.

While FIGS. 3A through 3E illustrate an n-channel VDMOS device 300, the devices 300 may also be fabricated as p-channel devices.

CONCLUSION

Although the subject matter has been described in language specific to structural features and/or process operations, it is to be understood that the subject matter defined in the appended claims is not necessarily limited to the specific features or acts described above. Rather, the specific features and acts described above are disclosed as example forms of implementing the claims.

What is claimed is:

1. A semiconductor device comprising:
   a substrate having a first surface and a second surface;
   a first source region of a first conductivity type and a first body region of a second conductivity type formed in the substrate proximal to the first surface, the first source region formed in the first body region;
   a second source region of the first conductivity type and a second body region of the second conductivity type formed in the substrate proximal to the first surface, the second source region formed in the second body region;
   a drain region of the first conductivity type formed in the substrate proximal to the second surface;
   an epitaxial region of the first conductivity type formed in the substrate configured to function as a drift region between the drain region and the first and the second source regions;
   a dual-gate formed over the first surface and including a first gate proximal to the first body region and a second gate proximal to the second body region, the first gate and the second gate defining a gap there between, the first gate discrete from the second gate; and
   at least one drain side spacer disposed in the gap.

2. The semiconductor device as recited in claim 1, further including a junction field effect transistor (JFET) diffusion region of the first conductivity type disposed in the epitaxial region, the JFET diffusion region extending from the first surface to below the first body region or the second body region.

3. The semiconductor device as recited in claim 2, wherein the epitaxial region comprises a first dopant concentration and the JFET diffusion region comprises a second dopant concentration, the first dopant concentration higher than the second dopant concentration.

4. The semiconductor device as recited in claim 1, further comprising a conductive layer formed over the first gate and the second gate.

5. The semiconductor device as recited in claim 4, wherein a thickness of the conductive layer is about 0.1 microns to about 0.5 microns.

6. The semiconductor device as recited in claim 1, further comprising a first below source region of the second conductivity type formed under the first source region and a second below source region of the second conductivity type formed under the second source region.

7. The semiconductor device as recited in claim 6, wherein the first below source region and the second below source region comprise dopant material of the second conductivity type.

8. A semiconductor device comprising:
a substrate having a first surface and a second surface;
a first source region of a first conductivity type and a first body region of a second conductivity type formed in the substrate proximal to the first surface, the first source region formed in the first body region;
a second source region of the first conductivity type and a second body region of the second conductivity type formed in the substrate proximal to the first surface, the second source region formed in the second body region;
a drain region of the first conductivity type formed in the substrate proximal to the second surface;
an epitaxial region of the first conductivity type formed in the substrate configured to function as a drift region between the drain region and the first and the second source regions;
a dual-gate formed over the first surface and including a first gate proximal to the first body region and a second gate proximal to the second body region, the first gate discrete from the second gate, the first gate region and the second gate region defining a gap there between;
at least one drain side spacer disposed in the gap; and
a conductive layer formed over the first gate and the second gate.

9. The semiconductor device as recited in claim 8, further including a junction field effect transistor (JFET) diffusion region of the first conductivity type disposed in the epitaxial region, the JFET diffusion region extending from the first surface to below the first body region or the second body region.

10. The semiconductor device as recited in claim 9, wherein the epitaxial region comprises a first dopant concentration and the JFET diffusion region comprises a second dopant concentration, the first dopant concentration higher than the second dopant concentration.

11. The semiconductor device as recited in claim 8, wherein a thickness of the conductive layer is about 0.1 microns to about 0.5 microns.

12. The semiconductor device as recited in claim 8, further comprising a first below source region of the second conductivity type formed under the first source region and a second below source region of the second conductivity type formed under the second source region.

13. The semiconductor device as recited in claim 12, wherein the first region and the second region comprise dopant material of the second conductivity type.

14. The semiconductor device as recited in claim 9, wherein a first contact is electrically connected to the first gate and a second contact is electrically connected to the second gate.

* * * * *